United States Patent
Li et al.

(10) Patent No.: US 10,114,578 B2
(45) Date of Patent: Oct. 30, 2018

(54) SOLID STATE DISK AND DATA MOVING METHOD

(71) Applicant: Huawei Technologies Co., Ltd., Shenzhen (CN)

(72) Inventors: Yan Li, Chengdu (CN); Meng Zhou, Chengdu (CN); Po Zhang, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 50 days.

(21) Appl. No.: 15/192,614

(22) Filed: Jun. 24, 2016

(65) Prior Publication Data
US 2016/0306588 A1 Oct. 20, 2016

Related U.S. Application Data

(63) Continuation of application No. PCT/CN2014/084583, filed on Aug. 18, 2014.

(30) Foreign Application Priority Data

Dec. 27, 2013 (CN) .......................... 2013 1 0740030

(51) Int. Cl.
*G06F 3/06* (2006.01)
*G06F 11/10* (2006.01)
(Continued)

(52) U.S. Cl.
CPC ............ *G06F 3/0647* (2013.01); *G06F 3/061* (2013.01); *G06F 3/064* (2013.01); *G06F 3/0619* (2013.01);
(Continued)

(58) Field of Classification Search
CPC .. G06F 3/0647; G06F 11/1048; G06F 3/0659; G06F 3/064; G06F 3/061;
(Continued)

(56) References Cited

U.S. PATENT DOCUMENTS

| | | | |
|---|---|---|---|
| 7,958,430 B1 | 6/2011 | Kolokowsky et al. | |
| 2002/0073251 A1* | 6/2002 | Yamamoto | G06F 13/426 710/33 |

(Continued)

FOREIGN PATENT DOCUMENTS

| | | |
|---|---|---|
| CN | 101354906 A | 1/2009 |
| CN | 101436152 A | 5/2009 |
| CN | 103761988 A | 4/2014 |

OTHER PUBLICATIONS

J. Jeong and Y. H. Song, "A technique to improve garbage collection performance for NAND flash-based storage systems," in IEEE Transactions on Consumer Electronics, vol. 58, No. 2, pp. 470-478, May 2012.*

(Continued)

*Primary Examiner* — Cynthia Britt
(74) *Attorney, Agent, or Firm* — Slater Matsil, LLP

(57) ABSTRACT

A solid state disk and a data moving method are disclosed. The SSD includes a storage medium and a control chip, where storage space of the storage medium is divided into at least two blocks for storing data, and the control chip includes: a service processing module sends a moving command to a moving module; and the moving module receives the moving command; read valid data from the source block according to the moving command, and perform ECC checking on the valid data; and write checked data into a blank page of the destination block. The SSD can control movement of data from a source block to a blank page of a destination block; compared with a data moving process in which read and write are separated, a path that data moving passes through is simple and reduce impact of the data moving process on performance of the SSD.

20 Claims, 5 Drawing Sheets

(51) Int. Cl.
*G11C 16/32* (2006.01)
*G11C 16/34* (2006.01)
*G11C 29/52* (2006.01)
*G11C 29/04* (2006.01)

(52) U.S. Cl.
CPC .......... *G06F 3/0656* (2013.01); *G06F 3/0659* (2013.01); *G06F 3/0679* (2013.01); *G06F 11/1048* (2013.01); *G06F 11/1068* (2013.01); *G11C 16/32* (2013.01); *G11C 16/3495* (2013.01); *G11C 29/52* (2013.01); *G11C 2029/0411* (2013.01); *G11C 2207/2236* (2013.01)

(58) Field of Classification Search
CPC .. G06F 11/1068; G06F 3/0619; G06F 3/0656; G06F 3/0679; G11C 2029/0411; G11C 29/52; G11C 16/32; G11C 16/3495; G11C 2207/2236
See application file for complete search history.

(56) References Cited

U.S. PATENT DOCUMENTS

| | | | | |
|---|---|---|---|---|
| 2002/0145920 A1* | 10/2002 | Shinohara | ............... | G11C 7/22 365/191 |
| 2003/0156454 A1* | 8/2003 | Wei | .................... | G11C 7/1006 365/185.17 |
| 2006/0050314 A1 | 3/2006 | Shiga et al. | | |
| 2006/0136687 A1* | 6/2006 | Conley | .................. | G11C 16/10 711/162 |
| 2010/0042757 A1* | 2/2010 | Yoshioka | ............... | G06F 13/28 710/33 |
| 2010/0162081 A1 | 6/2010 | Joo | | |
| 2010/0269015 A1* | 10/2010 | Borchers | ............ | G06F 12/0246 714/758 |
| 2011/0022778 A1 | 1/2011 | Schibilla et al. | | |
| 2011/0252177 A1 | 10/2011 | Cho | | |
| 2011/0276857 A1 | 11/2011 | Kim et al. | | |
| 2012/0023387 A1 | 1/2012 | Wang et al. | | |
| 2012/0166910 A1* | 6/2012 | Baek | ................... | G06F 11/1044 714/758 |
| 2013/0024644 A1* | 1/2013 | Givargis | ............ | G06F 12/0246 711/203 |
| 2013/0086315 A1 | 4/2013 | Kim | | |
| 2013/0179635 A1* | 7/2013 | Zhang | .................. | G06F 3/0689 711/114 |
| 2016/0306588 A1 | 10/2016 | Li et al. | | |

OTHER PUBLICATIONS

M. Nishi et al., "NAND Flash Memory-Based SSD Controller Using Full Page-Associative Block Recycling Mechanism," 2011 3rd IEEE International Memory Workshop (IMW), Monterey, CA, 2011, pp. 1-4.*

* cited by examiner

SOLID STATE DISK AND DATA MOVING METHOD

CROSS-REFERENCE TO RELATED APPLICATIONS

This application is a continuation of International Application No. PCT/CN2014/084583, filed on Aug. 18, 2014, which claims priority to Chinese Patent Application No. 201310740030.1, filed on Dec. 27, 2013, both of which are hereby incorporated by reference in their entireties.

TECHNICAL FIELD

The present invention relates to the field of data storage, and in particular, to a solid state disk and a data moving method.

BACKGROUND

A solid state disk (SSD) may be implemented by using a NAND flash. The NAND flash is a non-volatile random access storage medium, and is characterized by that data does not disappear after poweroff. Before performing a re-write operation, the NAND flash needs to perform an erase operation first. Because a write operation uses page as a unit, an erase operation uses block as a unit, and a block needing to be erased may include a page into which valid data is written, the SSD may reserve some redundant area for data moving.

Movement of valid data requires a read control process and a write control process. In the read control process, a control chip reads valid data in a valid page in a source block to a read buffer. An error correcting code unit (ECU) performs error correcting code (ECC) checking on the valid data. In the ECC checking process, the valid data is decoded, data that passes the check and is decoded is written into a double data rate synchronous dynamic random access memory (DDR) through a direct memory access (DMA) data path. In the write control process, the control chip reads the decoded data from the DDR, sends, through the DMA data path, the data to the ECU for ECC coding, and writes coded valid data to a write buffer; and then, the write buffer writes the data into a blank block of the SSD.

To sum up, in a process of data moving in an existing SSD, the SSD needs to preempt back-end ECU resources, DDR resources, DMA data path resources, and CPU resources, and the like with a host, thereby degrading performance of the SSD.

SUMMARY

In view of this, a technical problem to be resolved by the present invention is how to improve the data processing efficiency of an SSD and reduce impact on performance of the SSD in a data moving process.

To resolve the foregoing technical problem, according to a first aspect, the present invention provides a solid state disk, including: a storage medium and a control chip, where storage space of the storage medium is divided into at least two blocks for storing data, and the control chip includes a service processing module configured to send a moving command to a moving module, where the moving command is used to instruct the moving module to move data from a source block to a destination block, the moving command includes an address of the source block and an address of the destination block, the source block is a block, from which data needs to be moved out, in the storage medium, and the destination block is a block, into which data needs to be written, in the storage medium. The moving module is configured to receive the moving command sent by the service processing module; read valid data from the source block according to the moving command, and perform error correcting code ECC checking on the valid data; and write checked data into a blank page of the destination block.

With reference to the first aspect, in a first possible implementation manner, the moving module includes a control unit and an error correcting code unit ECU, where the control unit is configured to: after the moving command is received, read the valid data from the source block, and send the valid data to the ECU. The ECU is configured to perform error correcting code ECC checking on the valid data. The control unit is further configured to write the data checked by the ECU into the blank page of the destination block.

With reference to the first possible implementation manner of the first aspect, in a second possible implementation manner, the moving module further includes: a read buffer, configured to temporarily store the valid data that is read from the source block by the control unit, where the control unit is further configured to read the valid data from the read buffer, and send the valid data to the ECU.

With reference to the first or second possible implementation manner of the first aspect, in a third possible implementation manner, the moving module further includes: a write buffer, configured to temporarily store the data checked by the ECU, where the control unit is further configured to read, from the write buffer, the data checked by the ECU, and write the checked data into the blank page of the destination block.

With reference to the first, second, or third possible implementation manner of the first aspect, in a fourth possible implementation manner, the ECU is specifically configured to: if a result of checking performed by the ECU on the valid data is correct, determine that the valid data is the data checked by the ECU; or if a result of checking performed by the ECU on the valid data is incorrect, perform correction processing on the valid data, and determine that data obtained after the correction processing is the data checked by the ECU.

To resolve the foregoing technical problem, according to a second aspect, the present invention provides a data moving method, where the method is applied to a solid state disk, where the solid state disk includes a storage medium and a control chip, storage space of the storage medium is divided into at least two blocks for storing data, and the control chip includes a service processing module and a moving module, the method includes receiving, by the moving module, a moving command sent by the service processing module, where the moving command is used to instruct the moving module to move data from a source block to a destination block, the moving command includes an address of the source block and an address of the destination block, the source block is a block, from which data needs to be moved out, in the storage medium, and the destination block is a block, into which data needs to be written, in the storage medium. The method further includes reading, by the moving module, valid data from the source block according to the moving command, and after performing ECC checking on the valid data, writing checked data into a blank page of the destination block.

With reference to the second aspect, in a first possible implementation manner, the reading, by the moving module, valid data from the source block according to the moving command, and after performing ECC checking on the valid data, writing checked data into a blank page of the destination block includes: reading, by a control unit of the moving module, the valid data from the source block after the moving command is received, and sending the valid data to an ECU of the moving module. The method further includes performing, by the ECU, ECC checking on the valid data; and writing, by the control unit, the data checked by the ECU into the blank page of the destination block.

With reference to the first possible implementation manner of the second aspect, in a second possible implementation manner, the moving module further includes a read buffer, and the sending, by a control unit, the valid data to an ECU includes: temporarily storing, by the control unit to the read buffer, the valid data read from the source block; and reading, by the control unit, the valid data from the read buffer, and sending the valid data to the ECU.

With reference to the first or second possible implementation manner of the second aspect, in a third possible implementation manner, the moving module further includes a write buffer, and the writing, by the control unit, the data checked by the ECU into the blank page of the destination block includes: temporarily storing, by the control unit, the data checked by the ECU to the write buffer; and reading, by the control unit from the write buffer, the data checked by the ECU, and writing the checked data into the blank page of the destination block.

With reference to the first, second, or third possible implementation manner of the second aspect, in a fourth possible implementation manner, the performing, by the ECU, ECC checking on the valid data includes: if a result of checking performed by the ECU on the valid data is correct, determining, by the ECU, that the valid data is the data checked by the ECU; or if a result of checking performed by the ECU on the valid data is incorrect, performing, by the ECU, correction processing on the valid data, and determining that data obtained after the correction processing is the data checked by the ECU.

In embodiments of the present invention, when data needs to be moved, the service processing module of the solid state disk may send a moving command to the moving module, the moving module may control movement of the data from a source block to a blank page of a destination block by using the moving command; compared with a data moving process in which read and write are separated, a path that data moving passes through is simple, which can improve the data moving efficiency of the solid state disk, reduce back-end resources occupied by data moving, and reduce impact of a data moving process on performance of the solid state disk.

BRIEF DESCRIPTION OF THE DRAWINGS

The accompanying drawings included in this specification and constituting a part of this specification show exemplary embodiments, features, and aspects together with this specification, and are used to explain principles of the present invention.

DETAILED DESCRIPTION OF ILLUSTRATIVE EMBODIMENTS

Embodiment 1

Figure 1:
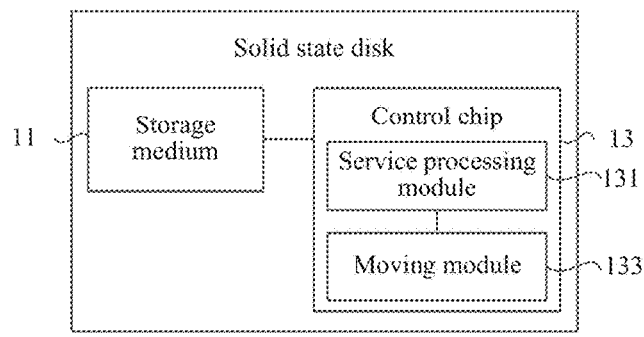
FIG. 1 is a schematic structural diagram of a solid state disk according to Embodiment 1 of the present invention.

FIG. 1 is a schematic structural diagram of a solid state disk according to Embodiment 1 of the present invention. As shown in FIG. 1, the solid state disk (SSD) includes a storage medium 11 and a control chip 13, where storage space of the storage medium 11 is divided into at least two blocks for storing data, and the control chip 13 includes a service processing module 131, configured to send a moving (MOVE) command to a moving module, where the moving command is used to instruct the moving module to move data from a source block to a destination block, the moving command includes an address of the source block and an address of the destination block, the source block is a block, from which data needs to be moved out, in the storage medium 11, and the destination block is a block, into which data needs to be written, in the storage medium 11. The moving module 133 is configured to receive the moving command sent by the service processing module 131; read valid data from the source block according to the moving command, and perform error correcting code ECC checking on the valid data; and write checked data into a blank page of the destination block.

Specifically, the storage medium 11 in the solid state disk may be implemented by using a non-volatile memory, such as a NAND flash. The NAND flash may be formed by an internal register and a storage matrix, where the storage matrix may include several blocks, each block includes several pages, and each page includes several bytes. Sizes of storage matrices of NAND Flashes may be different. For example, in a storage matrix of a NAND Flash, 4224 bytes may form one page, 128 pages may form one block, and 8192 blocks may form the storage matrix of the entire NAND Flash. The first 4096 bytes of each page may be used to store data, and the last 128 bytes may be used to store ECC data checking code, and are referred to as an out of band (OOB) area. A state of each page may be valid or invalid, where data in a page in a valid state is valid data, and data in a page in an invalid state is invalid data.

Figure 2:
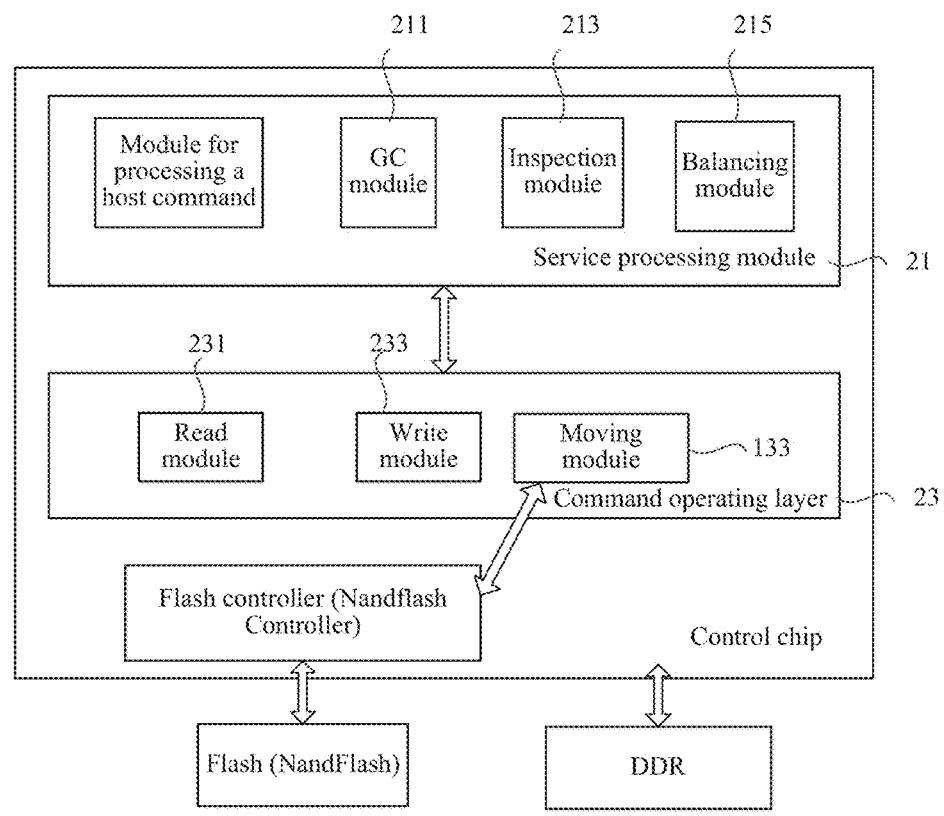
FIG. 2 is a schematic diagram of a working principle of a control chip of the solid state disk according to Embodiment 1 of the present invention.

The control chip 13 of the SSD may include multiple service processing modules 131, for example, a module for processing a garbage collection (GC) service may be a GC module, a module for processing an inspection service may be an inspection module, and a module for processing a balancing service may be a balancing module. In a process of processing a service, such as GC, inspection, and balancing, valid data may need to be moved. In this case, the related service processing module 131 may deliver the moving command to the moving module 133, to instruct the moving module 133 to move data from the source block to the destination block. FIG. 2 is a schematic diagram of a working principle of the control chip 13 in the solid state disk according to Embodiment 1 of the present invention. As shown in FIG. 2, the control chip 13 may be divided into a service processing layer 21 and a flash related command operating layer 23, where the service processing modules 131, such as the GC module 211, the inspection module 213, and the balancing module 215, belong to the service processing layer 21, and the command operating layer 23 may include a read module 231 of the NAND Flash, a write module 233 of the NAND flash, and the moving module 133, and the like. When the service processing module 131 needs to perform only a data read operation, the data read operation may be controlled by the read module 231; when the service processing module 131 needs to perform only a data write operation, the data write operation may be controlled by the write module 233; when the service processing module 131 needs to perform a data moving operation, an address of a source block from which data needs to be moved out and an address of a destination block into which data needs to be written may be encapsulated into the moving command, and the service processing module such as the GC module 211, the inspection module 213, or the balancing module 215 sends the moving command to the moving module 133, to control data moving in the NAND flash.

Using data moving in a GC process as an example: in the GC process, all valid data in a source block on a GC chain needs to be moved to a blank block, and the source block is erased, so as to achieve an objective of releasing space. A process of moving all valid data in a source block to a blank block is a data moving process. In this case, the GC module 211 may send a moving command to the moving module 133, to provide an address of a source block from which data needs to be moved out and an address of a destination block into which data needs to be written to the moving module 133. Then, the moving module 133 may read the valid data from the source block of the NAND Flash, and after performing ECC checking, the moving module 133 writes checked data into a blank page of the destination block. After all valid data in the source block is moved out, the source block may be erased, thereby achieving an objective of recycling storage space of the source block.

In this embodiment, when data needs to be moved, the service processing module of the solid state disk may send a moving command to the moving module, the moving module may control movement of the data from a source block to a blank page of a destination block by using the moving command; compared with a data moving process in which read and write are separated, a path that data moving passes through is simple, which can improve the data moving efficiency of the SSD, reduce back-end resources occupied by data moving, for example, system resources such as a DMA data path, a DDR, and CPU, and reduce impact of a data moving process on performance of the SSD.

Embodiment 2

Figure 3A:
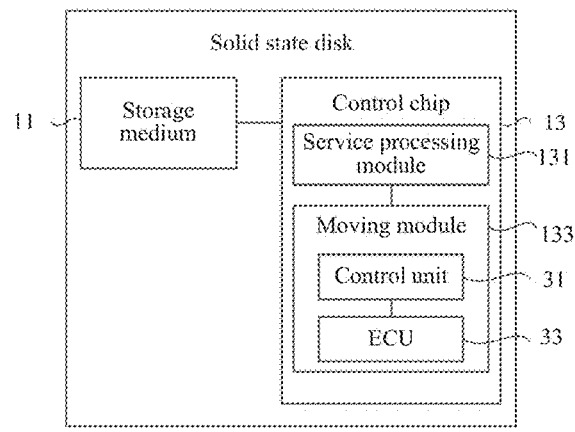
FIG. 3a is a schematic structural diagram of a solid state disk according to Embodiment 2 of the present invention.

FIG. 3a is a schematic structural diagram of a solid state disk according to Embodiment 2 of the present invention. As shown in FIG. 3a, based on the previous embodiment, the moving module 133 of the solid state disk may include: a control unit 31 and an error correcting code unit ECU 33.

The control unit 31 is configured to: after the moving command is received, read the valid data from the source block, and send the valid data to the ECU 33.

The ECU 33 is configured to perform error correcting code ECC checking on the valid data.

The control unit 31 is further configured to write the data checked by the ECU 33 into the blank page of the destination block.

Figure 3B:
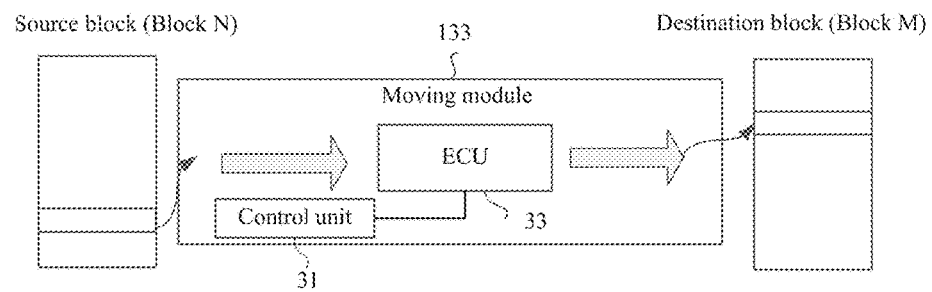
FIG. 3b and FIG. 3c are schematic diagrams of data moving in the solid state disk according to Embodiment 2 of the present invention.
Figure 3C:
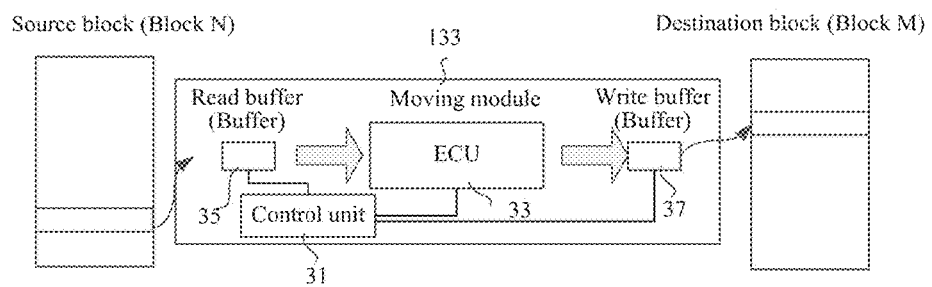

Specifically, FIG. 3b and FIG. 3c are schematic diagrams of data moving in the solid state disk according to Embodiment 2 of the present invention. As shown in FIG. 3b, the moving module 133 may form an independent data moving path by using the control unit 31 and the ECU 33, and does not need to occupy other resources of the system.

In a possible implementation manner, as shown in FIG. 3c, the moving module 133 may further include: a read buffer 35, configured to temporarily store the valid data that is read from the source block by the control unit 31, where the control unit 31 is further configured to read the valid data from the read buffer 35, and send the valid data to the ECU 33.

Specifically, a speed at which the ECU 33 performs ECC checking is usually faster than a speed at which the control unit 31 reads valid data; therefore, the read buffer 35 may first buffer some valid data that is pre-read from the source block by the control unit 31, and then, the ECU 33 performs ECC checking, which can reduce time spent by the ECU 33 in waiting for data reading, thereby increasing the data moving speed.

In a possible implementation manner, as shown in FIG. 3c, the moving module 133 may further include: a write buffer 37, configured to temporarily store the data checked by the ECU 33, where the control unit 31 is further configured to read, from the write buffer 37, the data checked by the ECU 33, and write the checked data into the blank page of the destination block.

Specifically, because the ECU 33 performs ECC checking at a fast speed, the data checked by the ECU 33 may be buffered to the write buffer 37 first, which can reduce time spent by the ECU 33 in waiting for data writing, thereby increasing the data moving speed.

The read buffer and the write buffer may be implemented in a form of a buffer, FIFO, or a RAM.

In a possible implementation manner, the ECU 33 may be specifically configured to: if a result of checking performed by the ECU 33 on the valid data is correct, determine that the valid data is the data checked by the ECU 33; or if a result of checking performed by the ECU 33 on the valid data is incorrect, perform correction processing on the valid data, and determine that data obtained after the correction processing is the data checked by the ECU 33.

Specifically, after data is written into the SSD, as time elapses, bit transition may occur, and in a general case, a longer time may cause transition to more bits; therefore, ECC checking needs to be performed. Although in a process of performing ECC checking on the valid data, the ECU 33 needs to decode the valid data, because the control unit 31 of the moving module 133 can directly acquire the valid data, the decoded data does not need to be coded again, and the checked data can be directly written into the blank page of the destination block. If a result of performing, by the ECU 33, ECC checking on the valid data is correct, the control unit 31 may directly use the valid data as the checked data and write the data into the blank page of the destination block; if a result of performing, by the ECU 33, ECC checking on the valid data is wrong, the control unit 31 may use data obtained after error correcting as the checked data and write the data into the blank page of the destination block.

For example, if valid data in Page 2 of a Block N in the SSD is "01010111", but data that enters the ECC checking in ECU 33 and is read by the control unit 31 is "01010111", after ECC checking, it may be known that no transition occurs in the valid data, and the checking result is correct. However, if data that enters the ECC checking in the ECU 33 and is read by the control unit 31 is "01010110", it may be known that transition occurs in one bit, and ECC correcting needs to be performed, to correct "01010110" to "01010111".

In this embodiment, when data needs to be moved, the service processing module of the SSD may send a moving command to the moving module, the moving module may control movement of the data from a source block to a blank page of a destination block by using the moving command; compared with a data moving process in which read and write are separated, a path that data moving passes through is simple, which can improve the data moving efficiency of the SSD, reduce back-end resources occupied by data moving, for example, system resources such as a DMA data path, a DDR, and CPU, and reduce impact of a data moving process on performance of the SSD. In addition, because the moving module can directly write the valid data (or corrected valid data) into a blank page of the destination block, re-coding does not need to be performed, which can reduce data moving processes, further improve the data moving efficiency of the SSD, and reduce impact of the data moving process on performance of the SSD.

Embodiment 3

Figure 4:
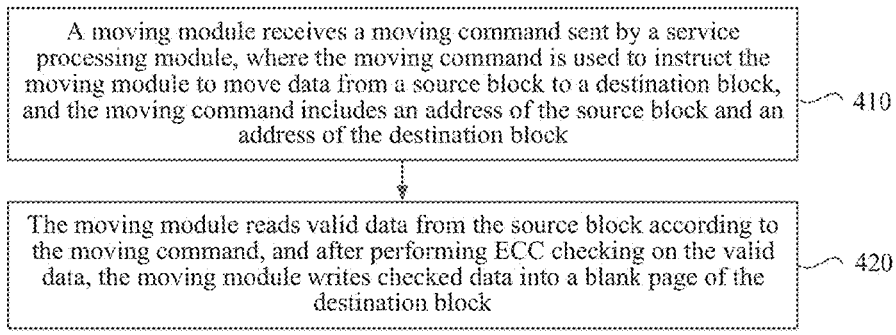
FIG. 4 is a flowchart of a data moving method according to Embodiment 3 of the present invention.

FIG. 4 is a flowchart of a data moving method according to Embodiment 3 of the present invention. The data moving method may be applied to a solid state disk of any structure in the foregoing embodiments. Referring to FIG. 1, the solid state disk may include a storage medium and a control chip, where storage space of the storage medium is divided into at least two blocks for storing data, and the control chip includes a service processing module and a moving module. The storage medium in the solid state disk may be implemented by using a non-volatile memory, such as a NAND flash (NAND Flash). For a specific structure of the NAND Flash, reference may be made to related descriptions in the foregoing embodiments of the solid state disk.

As shown in FIG. 4, the data moving method may include.

Step 410: The moving module receives a moving command sent by the service processing module, where the moving command is used to instruct the moving module to move data from a source block to a destination block, the moving command includes an address of the source block and an address of the destination block, the source block is a block, from which data needs to be moved out, in the storage medium, and the destination block is a block, into which data needs to be written, in the storage medium.

Step 420: The moving module reads valid data from the source block according to the moving command, and after performing ECC checking on the valid data, the moving module writes checked data into a blank page of the destination block.

Specifically, referring to FIG. 2, the control chip of the SSD may be divided into a service processing layer 21 and a flash (Flash) related command operating layer 23, where the service processing modules 131, such as the GC module 211, the inspection module 213, and the balancing module 215, belong to the service processing layer 21, and the command operating layer 23 may include the read module 231 of the NAND Flash, the write module 233 of the NAND flash, and the moving module 133, and the like. When the service processing module needs to perform only a data read operation, the data read operation may be controlled by the read module 231; when the service processing module needs to perform only a data write operation, the data write operation may be controlled by the write module 233; when the service processing module needs to perform a data moving operation, an address of a source block from which data needs to be moved out and an address of a destination block into which data needs to be written may be encapsulated into the moving command, and the moving module 133 controls data moving.

In the data moving method provided in this embodiment, when data needs to be moved, the service processing module may send a moving command to the moving module, the moving module may control movement of the data from a source block to a blank page of a destination block by using the moving command; compared with a data moving process in which read and write are separated, a path that data moving passes through is simple, which can improve the data moving efficiency of the SSD, reduce back-end resources occupied by data moving, for example, system resources such as a DMA data path, a DDR, and CPU, and reduce impact of a data moving process on performance of the SSD.

Embodiment 4

Figure 5:
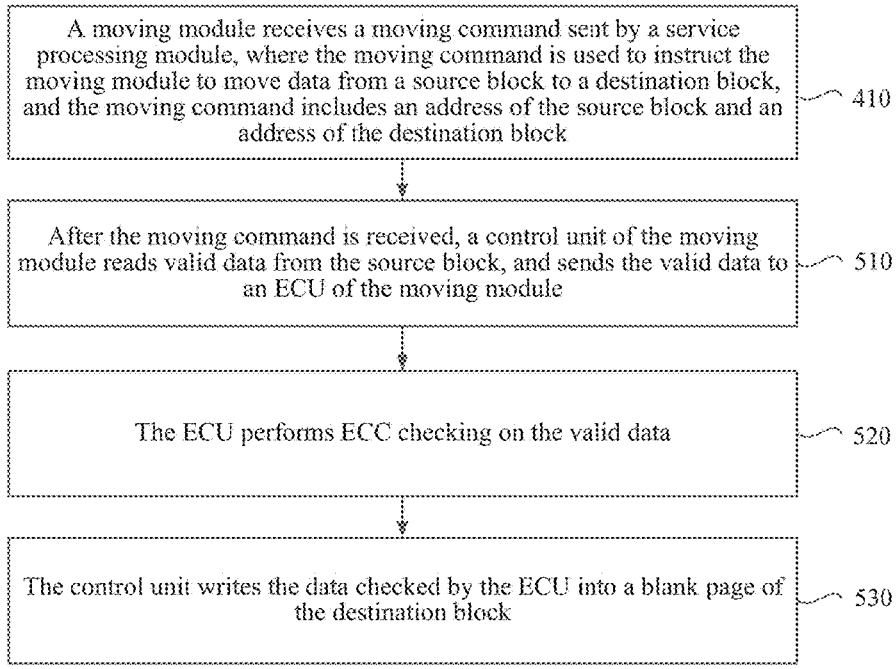
FIG. 5 is a flowchart of a data moving method according to Embodiment 4 of the present invention.

FIG. 5 is a flowchart of a data moving method according to Embodiment 4 of the present invention. Steps having the same numbers in FIG. 5 and FIG. 4 have the same functions, and for brief description, detailed descriptions of these steps are omitted.

As shown in FIG. 5, a difference from the method shown in FIG. 4 lies in that, step 420 may specifically include:

Step 510: After the moving command is received, a control unit of the moving module reads valid data from the source block, and sends the valid data to an ECU of the moving module.

Step 520: The ECU performs ECC checking on the valid data.

Step 530: The control unit writes the data checked by the ECU into a blank page of the destination block.

Figure 6:
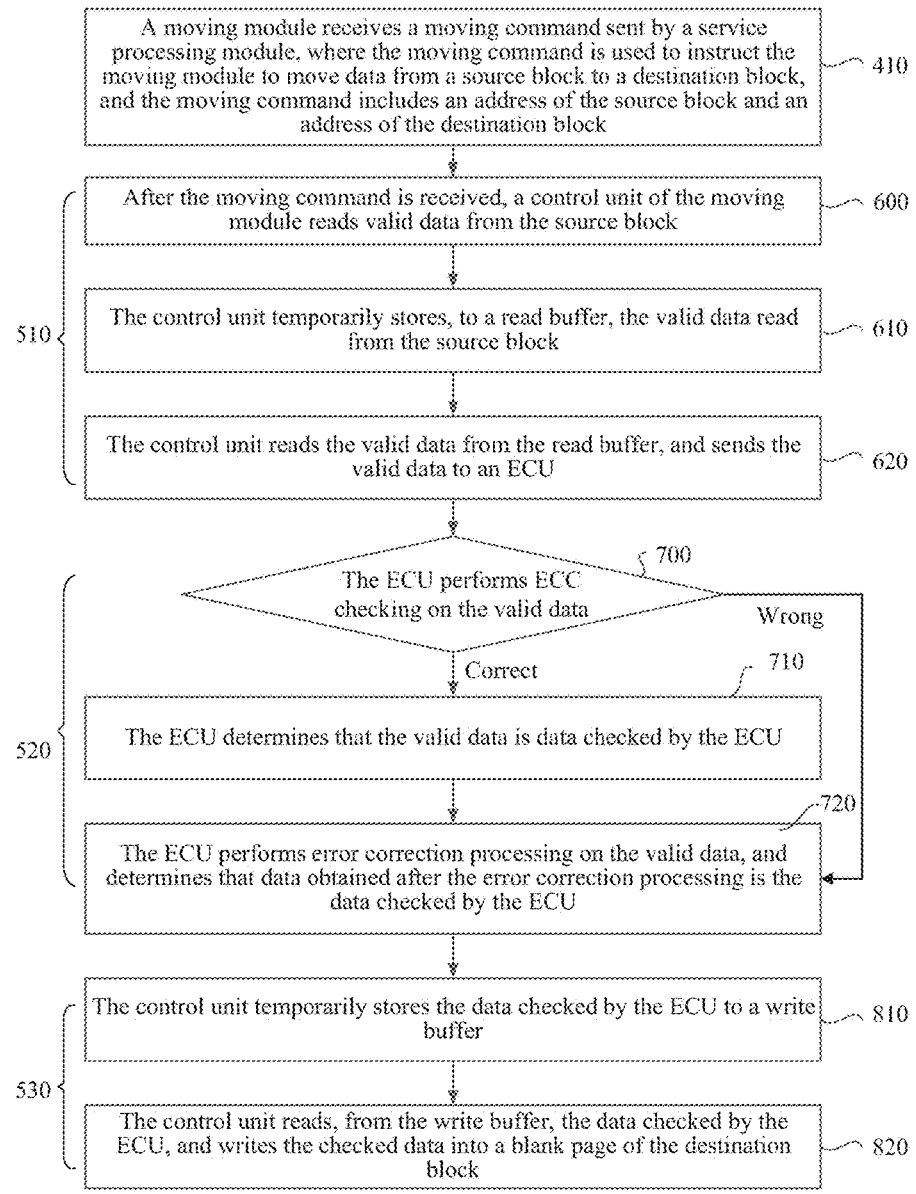
FIG. 6 is another flowchart of the data moving method according to Embodiment 4 of the present invention.

Referring to FIG. 3, the moving module may further include a read buffer. In this case, as shown in FIG. 6, step 510 may specifically include:

Step 600: After the moving command is received, the control unit of the moving module reads the valid data from the source block.

Step 610: The control unit temporarily stores, to the read buffer, the valid data read from the source block.

Step 620: The control unit reads the valid data from the read buffer, and sends the valid data to the ECU.

Specifically, a speed at which the ECU performs ECC checking is usually faster than a speed at which the control unit reads valid data; therefore, the read buffer may first buffer some valid data that is pre-read from the source block by the control unit, and then, the ECU performs ECC checking, which can reduce time spent by the ECU 33 in waiting for data reading.

Further, as shown in FIG. 6, step 520 may specifically include:

Step 700: The ECU performs ECC checking on the valid data, and if a result of checking performed by the ECU on the valid data is correct, performs step 710; or, if a result of checking performed by the ECU on the valid data is incorrect, performs step 720.

Step 710: The ECU determines that the valid data is the data checked by the ECU.

Step 720: The ECU performs error correction processing on the valid data, and determines that data obtained after the error correction processing is the data checked by the ECU.

Specifically, after data is written into the SSD, as time goes, bit transition may occur, and in a general case, a longer time may cause transition to more bits; therefore, ECC checking needs to be performed. Although in a process of performing ECC checking on the valid data, the ECU 33 needs to decode the valid data, because the control unit of the moving module can directly acquire the valid data, the decoded data does not need to be coded again, and the checked data can be directly written into the blank page of the destination block. If a result of performing, by the ECU, ECC checking on the valid data is correct, the control unit may directly use the valid data as the checked data and write the data into the blank page of the destination block; if a result of performing, by the ECU, ECC checking on the valid data is wrong, the control unit may use data obtained after error correcting as the checked data and write the data into the blank page of the destination block. For an example in which the ECU performs ECC checking on the valid data, reference may be made to related descriptions in the embodiment of the SSD.

Further, referring to FIG. 3, the moving module may further include a write buffer. In this case, as shown in FIG. 6, step 530 may specifically include:

Step 810: The control unit temporarily stores the data checked by the ECU to the write buffer.

Step 820: The control unit reads, from the write buffer, the data checked by the ECU, and writes the checked data into the blank page of the destination block.

Specifically, because compared with a speed of ECC checking, a speed of writing data into a blank page of a destination block in an SSD is relatively slow, valid data obtained after the ECC checking may be buffered to the write buffer first, to wait for being written into the destination block, so as to reduce time spent by the ECU in waiting for data writing, thereby increasing a data moving speed.

In the data moving method provided in this embodiment, when data needs to be moved, the service processing module of the SSD may send a moving command to the moving module, the moving module may control movement of the data from a source block to a blank page of a destination block by using the moving command; compared with a data moving process in which read and write are separated, a path that data moving passes through is simple, which can improve the data moving efficiency of the SSD, reduce back-end resources occupied by data moving, for example, system resources such as a DMA data path, a DDR, and CPU, and reduce impact of a data moving process on performance of the SSD. In addition, because the moving module can directly write the valid data (or corrected valid data) into a blank page of the destination block, re-coding does not need to be performed, which can reduce data moving processes, further improve the data moving efficiency of the SSD, and reduce impact of the data moving process on performance of the SSD.

Embodiment 5

Figure 7:
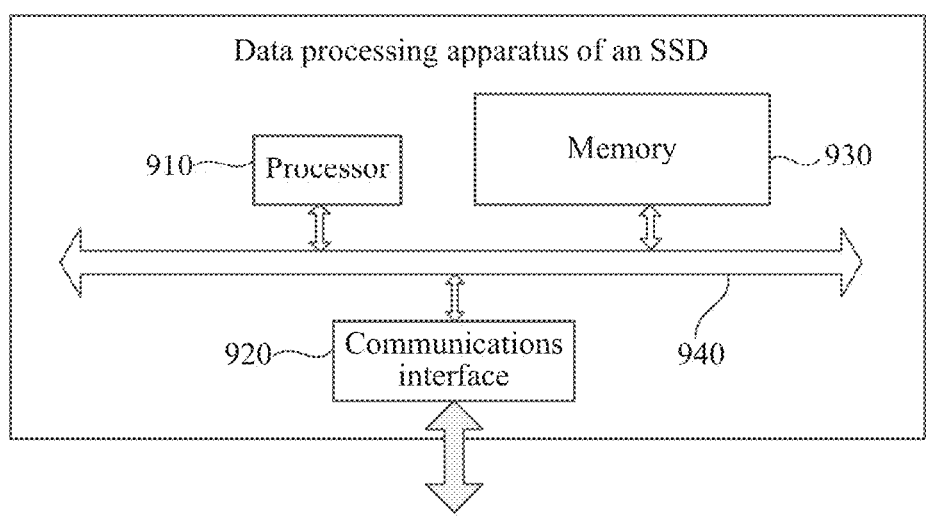
FIG. 7 is a schematic block diagram of a solid state disk according to Embodiment 5 of the present invention.

FIG. 7 is a schematic block diagram of a solid state disk according to Embodiment 5 of the present invention. The solid state disk may be a host server, a personal computer PC, or a portable computer or terminal, or the like having a computation capability. Specific embodiments of the present invention do not limit specific implementation of a computation node.

The solid state disk includes a processor 910, a communications interface 920, a memory (memory array) 930, and a bus 940. The processor 910, the communications interface 920, and the memory 930 communicate with each other by using the bus 940.

The communications interface 920 is configured to communicate with a network element, where the network element includes a virtual machine management center, a shared memory, and the like.

The processor 910 is configured to execute a program. The processor 910 may be a central processing unit CPU, or an application specific integrated circuit ASIC, or one or more integrated circuits configured to implement the embodiments of the present invention.

The memory 930 is configured to store a file. The memory 930 may include a high-speed RAM memory, or may include a non-volatile memory, for example, at least one disk memory. The memory 930 may also be a memory array. The memory 930 may be divided into blocks, and the blocks may be combined into a virtual volume according to a rule.

In a possible implementation manner, the program may be program code including a computer operation instruction, and the program may be specifically used to: the method is applied to a solid state disk, where the solid state disk includes a storage medium and a control chip, storage space of the storage medium is divided into at least two blocks for storing data, and the control chip includes a service processing module and a moving module. The method includes receiving, by the moving module, a moving command sent by the service processing module, where the moving command is used to instruct the moving module to move data from a source block to a destination block, the moving command includes an address of the source block and an address of the destination block, the source block is a block, from which data needs to be moved out, in the storage medium, and the destination block is a block, into which data needs to be written, in the storage medium. The method includes reading, by the moving module, valid data from the source block according to the moving command, and after performing ECC checking on the valid data, writing checked data into a blank page of the destination block.

In a possible implementation manner, the reading, by the moving module, valid data from the source block according to the moving command, and after performing ECC checking on the valid data, writing checked data into a blank page of the destination block includes: after the moving command is received, reading, by a control unit of the moving module, the valid data from the source block, and sending the valid data to an ECU of the moving module; performing, by the ECU, ECC checking on the valid data; and writing, by the control unit, the data checked by the ECU into the blank page of the destination block.

In a possible implementation manner, the moving module further includes a read buffer, and the sending, by a control unit, the valid data to an ECU includes: temporarily storing, by the control unit to the read buffer, the valid data read from the source block; and reading, by the control unit, the valid data from the read buffer, and sending the valid data to the ECU.

In a possible implementation manner, the moving module further includes a write buffer, and the writing, by the control unit, the data checked by the ECU into the blank page of the destination block includes: temporarily storing, by the control unit, the data checked by the ECU to the write buffer; and reading, by the control unit from the write buffer, the data checked by the ECU, and writing the checked data into the blank page of the destination block.

In a possible implementation manner, the performing, by the ECU, ECC checking on the valid data includes: if a result of checking performed by the ECU on the valid data is correct, determining, by the ECU, that the valid data is the data checked by the ECU; or if a result of checking performed by the ECU on the valid data is incorrect, performing, by the ECU, correction processing on the valid data, and determining that data obtained after the correction processing is the data checked by the ECU.

A person of ordinary skill in the art may be aware that, exemplary units and algorithm steps in the embodiments described in this specification may be implemented by electronic hardware or a combination of computer software and electronic hardware. Whether the functions are implemented by hardware or software depends on particular applications and design constraint conditions of the technical solutions. A person skilled in the art may select different methods to implement the described functions for a particular application, but it should not be considered that the implementation goes beyond the scope of the present invention.

If the function is implemented in a form of computer software, and is sold or used as an independent product, it may be considered to some extent that all or a part (for example, a part contributing to the prior art) of the technical solutions of the present invention is represented in a form of a computer software product. The computer software product is generally stored in a computer readable storage medium and includes several instructions for instructing a computer device (which may be a personal computer, a server, or a network device, and the like) to perform all or a part of the steps of the methods described in the embodiments of the present invention. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A solid state disk comprising:
a non-transitory storage medium, wherein storage space of the storage medium is divided into at least two blocks for storing data;
a service processor; and
a moving apparatus comprising a controller to access the storage medium and a data checker, wherein the moving apparatus receives a moving command from the service processor, wherein the moving command instructs the moving apparatus
to move first data from a source block to a destination block without the first data leaving the solid state disk, wherein the moving command comprises an address of the source block and an address of the destination block, wherein the source block is a block in the storage medium from which the first data is moved out, and wherein the destination block is a block in the storage medium into which the first data is written, wherein, in response to receiving the moving command from the service processor, the moving apparatus:
reads, by the controller, the first data as valid data from the source block according to the moving command,
performs, by the data checker, error correcting code (ECC) checking on the valid data, and
writes, by the controller, the first data as checked valid data into a blank page of the destination block.

2. The solid state disk according to claim 1, further comprising:
a read buffer configured to temporarily store the valid data read from the source block, wherein the ECC checking is performed on the valid data from the read buffer.

3. The solid state disk according to claim 2, further comprising:
a write buffer configured to temporarily store the checked valid data after performing ECC checking, wherein writing the checked valid data is executed on the valid data from the write buffer.

4. The solid state disk according to claim 3, wherein the moving apparatus is configured to:
when a result of performing ECC checking on the valid data is correct, determine that the valid data is the checked valid data; and
when a result of performing ECC checking on the valid data is incorrect, perform correction processing on the valid data, and determine that data obtained after the correction processing is the checked valid data.

5. The solid state disk according to claim 2, wherein the moving apparatus is configured to:
when a result of performing ECC checking on the valid data is correct, determine that the valid data is the checked valid data; and
when a result of performing ECC checking on the valid data is incorrect, perform correction processing on the valid data, and determine that data obtained after the correction processing is the checked valid data.

6. The solid state disk according to claim 1, further comprising:
a write buffer configured to temporarily store the checked valid data after performing ECC checking, wherein writing the checked valid data is executed on the valid data from the write buffer.

7. The solid state disk according to claim 6, wherein the moving apparatus is configured to:
when a result of performing ECC checking on the valid data is correct, determine that the valid data is the checked valid data; and
when a result of performing ECC checking on the valid data is incorrect, perform correction processing on the valid data, and determine that data obtained after the correction processing is the checked valid data.

8. The solid state disk according to claim 1, wherein the moving apparatus is configured to:
when a result of performing ECC checking on the valid data is correct, determine that the valid data is the checked valid data; and
when a result of performing ECC checking on the valid data is incorrect, perform correction processing on the valid data, and determine that data obtained after the correction processing is the checked valid data.

9. A data moving method, comprising:
processing, by a solid state disk, a moving command to move first data from a source block of a storage medium of the solid state disk to a destination block of the storage medium without the first data leaving the solid state disk, wherein the moving command comprises an address of the source block and an address of the destination block, wherein the source block is a block in the storage medium from which the first data is moved out, and the destination block is a block in the storage medium into which the first data is written;

reading the first data, by the solid state disk, as valid data from the source block according to the moving command;

performing, by the solid state disk, error correcting code (ECC) checking on the valid data; and writing the first data, by solid state disk, as checked valid data into a blank page of the destination block.

10. The data moving method according to claim 9, wherein performing ECC checking on the valid data comprises:

temporarily storing, by the solid state disk to a read buffer of the solid state disk, the valid data read from the source block; and reading, by the solid state disk, the valid data from the read buffer, and performing ECC checking on the valid data.

11. The data moving method according to claim 10, wherein writing the checked valid data comprises:

temporarily storing, by the solid state disk, the checked valid data after performing ECC checking to a write buffer of the solid state disk;

reading, by the solid state disk from the write buffer, the checked valid data; and writing, by the solid state disk, the checked valid data into the blank page of the destination block.

12. The data moving method according to claim 11, further comprising:

when a result of performing ECC checking on the valid data is correct, determining that the valid data is the checked valid data; and when a result of performing ECC checking on the valid data is incorrect, performing correction processing on the valid data, and determining that data obtained after the correction processing is the checked valid data.

13. The data moving method according to claim 10, further comprising:

when a result of performing ECC checking on the valid data is correct, determining that the valid data is the checked valid data; and when a result of performing ECC checking on the valid data is incorrect, performing correction processing on the valid data, and determining that data obtained after the correction processing is the checked valid data.

14. The data moving method according to claim 9, wherein writing the checked valid data comprises:

temporarily storing, by the solid state disk, the checked valid data after performing ECC checking to a write buffer of the solid state disk;

reading, by the solid state disk from the write buffer, the checked valid data; and writing the checked valid data into the blank page of the destination block.

15. The data moving method according to claim 14, further comprising:

when a result of performing ECC checking on the valid data is correct, determining that the valid data is the checked valid data; and when a result of performing ECC checking on the valid data is incorrect, performing correction processing on the valid data, and determining that data obtained after the correction processing is the checked valid data.

16. The data moving method according to claim 9, further comprising:

when a result of performing ECC checking on the valid data is correct, determining that the valid data is the checked valid data; and when a result of performing ECC checking on the valid data is incorrect, performing correction processing on the valid data, and determining that data obtained after the correction processing is the checked valid data.

17. The method of claim 16, wherein the ECC checking comprises:

decoding the first data into second data and a ECC data checking code;

checking the second data against the ECC data checking code;

when a result of checking the second data and ECC data checking code is correct, determining, without encoding the first data, that the first data is the checked valid data; and when the result of checking the second data and ECC data checking code is incorrect, performing correction processing on the second data to produce the checked valid data.

18. A method, comprising:

determining from a moving command, by a control chip of a solid state disk, a first memory address corresponding to a source block of a storage medium of the solid state disk;

determining from the moving command, by the control chip, a second memory address corresponding to a destination block of the storage medium;

determining based on the moving command, by the control chip, to move a first data stored in the source block to the destination block;

reading, by the control chip, the first data from the source block according to the first memory address;

performing, internally to the solid state disk without the first data leaving the solid state disk, error correcting code (ECC) checking on the first data to produce checked first data; and writing, by the control chip, the checked first data to a blank page of the destination block according to the second memory address.

19. The method of claim 18, further comprising:

following reading the first data, temporarily storing the first data in a read buffer of the solid state device, wherein the ECC checking is performed on the first data directly from the read buffer.

20. The method of claim 19, further comprising:

before writing the checked first data to the blank page of the destination block, temporarily storing the checked first data in a write buffer of the solid state device, wherein writing the checked first data to the blank page uses the checked first data directly from the write buffer.

* * * * *